(12) United States Patent
Cheng et al.

(10) Patent No.: US 11,807,521 B2
(45) Date of Patent: *Nov. 7, 2023

(54) SUPPORT STRUCTURE FOR MEMS DEVICE WITH PARTICLE FILTER

(71) Applicant: Taiwan Semiconductor Manufacturing Co., Ltd., Hsin-Chu (TW)

(72) Inventors: Chun-Wen Cheng, Zhubei (TW); Chia-Hua Chu, Zhubei (TW); Wen Cheng Kuo, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 154 days.

This patent is subject to a terminal disclaimer.

(21) Appl. No.: 17/218,358

(22) Filed: Mar. 31, 2021

(65) Prior Publication Data

US 2021/0238030 A1  Aug. 5, 2021

Related U.S. Application Data

(63) Continuation of application No. 16/542,489, filed on Aug. 16, 2019, now Pat. No. 10,968,097.

(51) Int. Cl.
*B81C 1/00* (2006.01)
*B81B 3/00* (2006.01)
(Continued)

(52) U.S. Cl.
CPC ........ *B81C 1/00158* (2013.01); *B81B 3/0021* (2013.01); *B81B 7/0029* (2013.01); *B81C 1/0023* (2013.01); *B81C 1/00325* (2013.01); *B81C 1/00357* (2013.01); *B81C 1/00476* (2013.01); *B81C 1/00539* (2013.01);
(Continued)

(58) Field of Classification Search
CPC .............. B81C 1/00158; B81C 1/0023; B81C 1/00325; B81B 7/0029; B81B 7/0061; B81B 2201/0257
See application file for complete search history.

(56) References Cited

U.S. PATENT DOCUMENTS 8,447,057 B2   5/2013   Goida et al.
9,078,063 B2   7/2015   Loeppert et al.
(Continued)

FOREIGN PATENT DOCUMENTS

CN    105448648 A    3/2016
WO    2018223389     12/2018

OTHER PUBLICATIONS

U.S. Appl. No. 16/542,479, filed Aug. 16, 2019.
(Continued)

*Primary Examiner* — Matthew L Reames
(74) *Attorney, Agent, or Firm* — Eschweiler & Potashnik, LLC (57) ABSTRACT

Various embodiments of the present disclosure are directed towards a method for forming a microelectromechanical systems (MEMS) device. The method includes forming a filter stack over a carrier substrate. The filter stack comprises a particle filter layer having a particle filter. A support structure layer is formed over the filter stack. The support structure layer is patterned to define a support structure in the support structure layer such that the support structure has one or more segments. The support structure is bonded to a MEMS structure.

20 Claims, 10 Drawing Sheets (51) Int. Cl.
*B81B 7/00* (2006.01)
*B81C 3/00* (2006.01)
*H01L 23/00* (2006.01)
*H01L 23/053* (2006.01)

(52) U.S. Cl.
CPC .......... *B81C 1/00825* (2013.01); *B81C 3/001* (2013.01); *B81B 7/0006* (2013.01); *B81B 7/0061* (2013.01); *B81B 2201/0257* (2013.01); *B81B 2203/0127* (2013.01); *B81B 2207/012* (2013.01); *B81B 2207/115* (2013.01); *H01L 23/053* (2013.01); *H01L 24/48* (2013.01); *H01L 2224/48195* (2013.01)

(56) References Cited

U.S. PATENT DOCUMENTS

| | | |
|---|---|---|
| 10,609,463 B2 | 3/2020 | Cheng et al. |
| 2012/0237073 A1 | 9/2012 | Goida et al. |
| 2013/0058509 A1 | 3/2013 | Mietta et al. |
| 2015/0060955 A1 | 3/2015 | Chen |
| 2015/0294896 A1 | 10/2015 | Hurwitz et al. |
| 2018/0220216 A1 | 8/2018 | Agashe et al. |
| 2018/0362332 A1 | 12/2018 | Khenkin et al. |
| 2020/0169818 A1 | 5/2020 | Rombach |

OTHER PUBLICATIONS

Non Final Office Action dated Jun. 17, 2020 in connection with U.S. Appl. No. 16/542,479.

Notice of Allowance dated Nov. 5, 2020 in connection with U.S. Appl. No. 16/542,479.

Non-Final Office Action dated Jun. 17, 2020 for U.S. Appl. No. 16/542,489.

Notice of Allowance dated Dec. 4, 2020 for U.S. Appl. No. 16/542,489.

SUPPORT STRUCTURE FOR MEMS DEVICE WITH PARTICLE FILTER

REFERENCE TO RELATED APPLICATION

This application is a Continuation of U.S. application Ser. No. 16/542,489, filed on Aug. 16, 2019, the contents of which are hereby incorporated by reference in their entirety.

BACKGROUND

Microelectromechanical system (MEMS) devices, such as accelerometers, pressure sensors, and microphones, have found widespread use in many modern day electronic devices. For example, MEMS accelerometers and microphones are commonly found in automobiles (e.g., in airbag deployment systems), tablet computers, or in smart phones. MEMS devices may have a movable part, which is used to detect a motion, and convert the motion to an electrical signal. For example, a MEMS accelerometer includes a movable part that transfers accelerating movement to an electrical signal. A microphone includes a movable membrane that transfers sound to an electrical signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

Microelectromechanical system (MEMS) devices used for acoustical applications (e.g., MEMs microphones) are often housed within a package structure that has an opening (i.e., an inlet). The package structure is configured to provide protection of a MEMS device while the opening allows for sound waves to reach a cavity of the package structure holding the MEMS device. Within such a package structure, a MEMS device may be electrically coupled to an application-specific integrated circuit (ASIC) disposed within the cavity. The MEMS device has movable parts directly overlying the opening of the package structure, and a particle filter disposed between the movable parts and the opening of the package structure. The particle filter is configured to prevent particles from entering the opening of the package structure, thereby mitigating particles that reach the movable parts. Particles interacting with the movable parts may decreases performance of the MEMS device, for example, by causing short circuits and/or decreasing an acoustic overload point (AOP) of the MEMS device.

One approach to fabricate a particle filter for a MEMS device is to form the particle filter separate from fabricating the MEMS device and the ASIC. For example, the MEMS device may be fabricated with moveable elements, and the ASIC may be fabricated with semiconductor devices (e.g., transistors). A package substrate may be provided to integrate the MEMS device and ASIC. A package structure opening may be formed in the package substrate, and subsequently, a particle filter may be formed over the package structure opening. After forming the particle filter, the MEMS device is directly attached to the particle filter. Thus, the moveable elements of the MEMS device directly overlie the package structure opening.

A problem with the aforementioned approach is that the extra processing steps utilized to form the particle filter and directly attach the particle filter to the MEMS device increase time and costs associated with integrating the MEMS device and the ASIC on the package structure. Further, during the direct attachment process, a small thickness (e.g., less than 0.5 micrometers) of the particle filter may result in damage and/or destruction of the particle filter, thereby reducing an ability of the particle filter to protect the moveable elements from particles.

Alternatively, the particle filter and MEMS device may be formed as an integrated structure that can be attached to the package structure. While this approach may reduce the extra processing steps used to attach the particle filter to the MEMS device, the small thickness (e.g., less than 0.5 micrometers) of the particle filter may still lead to damage and/or destruction of the particle filter.

The present disclosure, in some embodiments, relates to a method that simplifies the fabrication of a MEMS device with a particle filter. The method forms the particle filter and MEMS device as an integrated structure prior to attaching the particle filter and MEMS device to a package structure. Further, the method employs a support structure, which is disposed between the particle filter and the moveable elements of the MEMS device. The support structure increases a structural integrity of the particle filter during and/or after fabrication of the MEMS device with the particle filter, thereby reducing damage to the particle filter. For example, while bonding the MEMS device to a support structure layer, the particle filter is susceptible to damage. However, the support structure eliminates or mitigates damage to the particle filter. This increases an ability for the particle filter to block and/or mitigate particles from interacting with the moveable elements, thereby increasing a performance, reliability, and endurance of the MEMS device.

Figure 1:
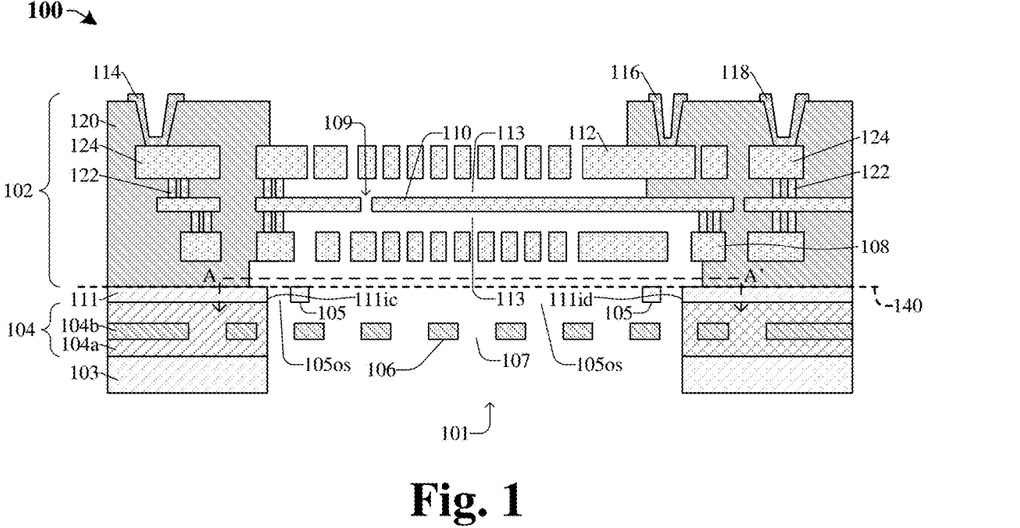
FIG. 1 illustrates a cross-sectional view of some embodiments of a microelectromechanical systems (MEMS) microphone having a particle filter and a support structure.

FIG. 1 illustrates a cross-sectional view of some embodiments of a microelectromechanical system (MEMS) microphone 100 with a particle filter 106 and a support structure 105.

The MEMS microphone 100 includes a MEMS structure 102, a support structure layer 111, a filter stack 104, and a carrier substrate 103. The filter stack 104 is disposed between the carrier substrate 103 and the support structure layer 111. The MEMS structure 102 includes conductive wires 124 and conductive vias 122 disposed within an inter-level dielectric (ILD) structure 120 overlying the support structure layer 111. The MEMS structure 102 further includes a first back plate 108, a second back plate 112, and a diaphragm 110 disposed between the first and second back plates 108, 112. The diaphragm 110 is spaced apart from the first back plate 108 and the second back plate 112 by one or more non-zero distances. Further, the diaphragm 110 and the first and second back plates 108, 112 can be electrically conductive, which forms a capacitive element. In some embodiments, an electrical contact 118 is electrically coupled to the diaphragm 110 and forms a first terminal for the capacitive element, an electrical contact 114 is electrically coupled to the first back plate 108 and forms a second terminal for the capacitive element, and an electrical contact 116 is electrically coupled to the second back plate 112 and forms a third terminal for the capacitive element. In some embodiments, the second terminal and the third terminal are electrically coupled together. In some embodiments, the electrical coupling is achieved through the conductive wires 124 and the conductive vias 122.

The diaphragm 110 includes one or more diaphragm openings 109 and may be anchored by the ILD structure 120 at multiple points. Anchoring the diaphragm 110 at the multiple points allows a boundary of the diaphragm 110 to be fixed relative to the first and second back plates 108, 112. The diaphragm 110 is deformable by energy of sound waves to make the diaphragm 110 bend towards or away from the first back plate 108 and/or the second back plate 112, as the sound waves exert pressure on the diaphragm 110 through a carrier substrate opening 101 in the carrier substrate 103. The carrier substrate 103 has sidewalls defining the carrier substrate opening 101 and the support structure layer 111 has sidewalls defining support structure openings 105os. The first and second back plates 108, 112 respectively comprise a plurality of openings by which air may pass through.

There is an air volume space 113 between the first and second back plates 108, 112. The air volume space 113 is above and below the diaphragm 110. Air can get out of or get into the air volume space 113 through air passage ways formed by the plurality of openings in each of the first and second back plates 108, 112, and/or through the one or more diaphragm openings 109 of the diaphragm 110. The air travels out of or into the air volume space 113 as the diaphragm 110 bends towards or away from the first back plate 108 and/or the second back plate 112. The bending movement of the diaphragm 110 relative to the first back plate 108 and/or the second back plate 112 by the sound waves changes the capacitance of the capacitive element between the diaphragm 110 and the first and/or second back plates 108, 112. Such change of the capacitance can be provided to external circuitry configured to measure the capacitance by way of the electrical contacts 114, 116, 118. The measured capacitance can be translated into an acoustical signal corresponding to sound waves that cause movement of the air.

The filter stack 104 includes a particle filter layer 104b defining the particle filter 106 disposed within a dielectric layer 104a. In some embodiments, the particle filter layer 104b may comprise polysilicon (e.g., intrinsic polysilicon), and the dielectric layer 104a may comprise an oxide (e.g., silicon oxide). The particle filter 106 is a segment of the particle filter layer 104b between the carrier substrate opening 101 and the support structure 105. The particle filter 106 has a plurality of filter openings 107 configured to pass air from the carrier substrate opening 101 to the air volume space 113. As the air travels through the carrier substrate opening 101 in the carrier substrate 103 to the air volume space 113, it passes through the particle filter 106, which is configured to block and/or remove particles from the air that may adversely affect the movement of the diaphragm 110. In some embodiments, the particles may, for example, be by-products from and/or chemicals used in a laser dicing process implemented to form the MEMS microphone 100, such as polysilicon, silicon dioxide, etc. The particles interacting with the diaphragm 110 may decrease a performance of the MEMS microphone 100 by, for example, causing short circuits (e.g., between the first and second back plates 108, 112 and/the diaphragm 110) and/or decreasing an acoustic overload point (AOP) of the MEMS microphone 100.

The support structure 105 is a segment of the support structure layer 111, wherein the support structure 105 comprises a same material as the support structure layer 111. In some embodiments, an upper surface of the support structure 105 and a lower surface of the MEMS structure 102 are respectively disposed along a substantially straight horizontal line 140. In some embodiments, the support structure layer 111 comprises silicon, polysilicon (e.g., intrinsic polysilicon), or the like. The support structure 105 comprises one or more segments (e.g., first elongated segments 105a of FIG. 2A) spaced laterally between the filter openings 107 and vertically between the particle filter 106 and the MEMS structure 102. By disposing the support structure 105 between the particle filter 106 and the MEMS structure 102, a structural integrity of the particle filter 106 is increased. For example, during a fabrication of the MEMS microphone 100, the support structure 105 may be formed over the filter stack 104. Subsequently, the MEMS structure 102 is bonded to the carrier substrate 103 by way of the support structure layer 111. The support structure 105 prevents damage and/or destruction to the particle filter layer 104b during the aforementioned bonding process. Further, the support structure 105 remains in place during subsequent processing steps and/or during operation of the MEMS microphone 100. Therefore, the support structure 105 may reduce or eliminate strain and/or damage to the particle filter 106, thereby increasing an endurance, reliability, and performance of the MEMS microphone 100. In some embodiments, the support structure layer 111 comprises first opposing inner sidewalls (e.g., 111ia, 111ib of FIG. 2B) continuously extending between second opposing inner sidewalls 111ic, 111id. In various embodiments, the second opposing inner sidewalls 111ic, 111id are aligned with the sidewalls of the carrier substrate 103 that define the carrier substrate opening 101.

Figure 2A:
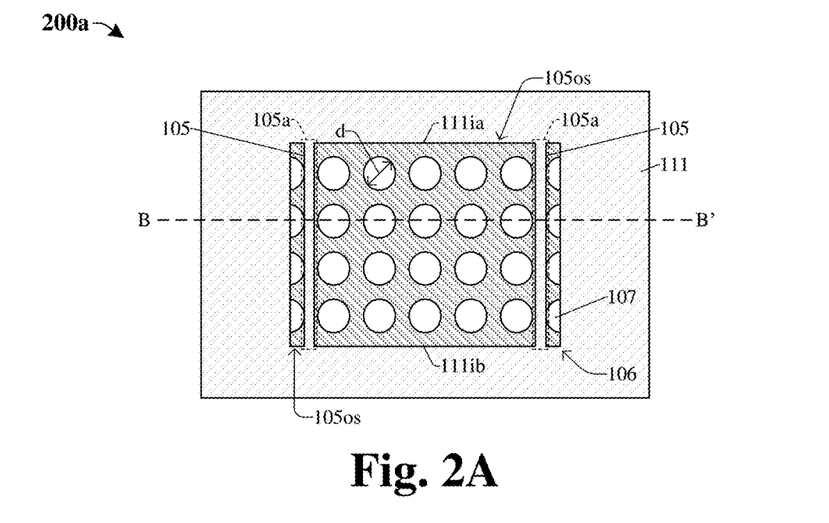
FIGS. 2A-D illustrate top views of some alternative embodiments of the MEMS microphone of FIG. 1.

FIG. 2A illustrates a top view 200a of some alternative embodiments of the support structure 105 and the particle filter 106 taken along cut line A-A' of FIG. 1. FIG. 1 illustrates some embodiments of a cross-sectional view taken along cut line B-B' of FIG. 2A.

The plurality of filter openings 107 underlie the support structure 105 and respectively have a circular and/or elliptical shape. The plurality of filter openings 107 may be arranged as an array comprising columns and/or rows across the carrier substrate opening (101 of FIG. 1). The particle filter 106 is configured to block and/or remove particles (e.g., by a shape/size of the filter openings 107 and/or a material of the particle filter layer 104b) from air that passes from a first surface of the particle filter 106 to an opposite second surface of the particle filter 106. The support structure 105 is a segment of the support structure layer 111 that extends over the filter openings 107 and provides structural support to the particle filter 106. The support structure 105 includes first elongated segments 105a that continuously extend between first opposing inner sidewalls 111ia, 111ib of the support structure layer 111. In some embodiments, the first elongated segments 105a of the support structure 105 are laterally offset the filter openings 107 by non-zero distances. In such embodiments, by laterally displacing the elongated segments from the filter openings 107 air may more easily flow from the filter openings 107, through the support structure openings 105os, to the air volume space 113. In further embodiments, the support structure 105 may include any number of first elongated segments 105a. For example, a first elongated segment 105a may be disposed between each adjacent column of the filter openings 107 (not shown).

In some embodiments, the filter openings 107 each have a diameter d that may, for example, be within a range of about 3 to 10 micrometers. In some embodiments, if the diameter d is less than about 3 micrometers, then an ability to pass air from the first surface of the particle filter 106 to the opposite second surface of that particle filter 106 may be mitigated, thereby decreasing a performance of the MEMS device structure 102. In further embodiments, if the diameter d is greater than about 10 micrometers, then an ability of the particle filter 106 to block and/or remove particles from the air that passes through the particle filter 106 may be reduced. For example, the particle filter openings 107 may be larger than the particles, such that the particles may pass through the particle filter openings and adversely affect the movement of the diaphragm (110 of FIG. 1).

Figure 2B:
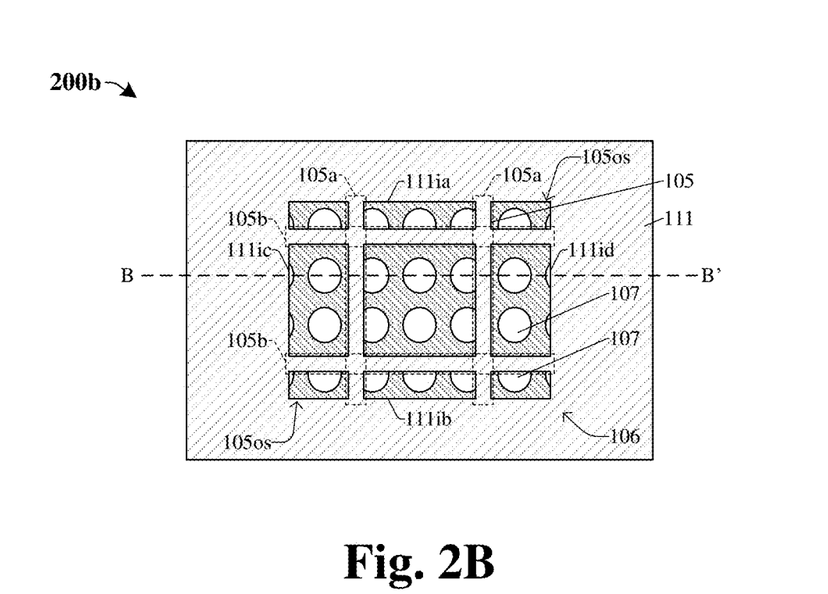

FIG. 2B illustrates a top view 200b of some alternative embodiments of the support structure 105 taken along cut line A-A' of FIG. 1. FIG. 1 illustrates some embodiments of a cross-sectional view taken along cut line B-B' of FIG. 2B.

The support structure 105 includes first elongated segments 105a and second elongated segments 105b. The first elongated segments 105a respectively continuously extend between first opposing inner sidewalls 111ia, 111ib, and the second elongated segments 105b respectively continuously extend between second opposing inner sidewalls 111ic, 111id. The first opposing inner sidewalls 111ia, 111ib continuously extend between the second opposing inner sidewalls 111ic, 111id. Further, the first elongated segments 105a respectively extend in a first direction and the second elongated segments 105b respectively extend in a second direction that is orthogonal to the first direction. In some embodiments, the first elongated segments 105a respectively intersect each second elongated segment 105b. In further embodiments, a first elongated segment 105a may be disposed between each adjacent column of the filter openings 107 and/or a second elongated segment 105b may be disposed between each adjacent row of the filter openings 107 (not shown).

Figure 2C:
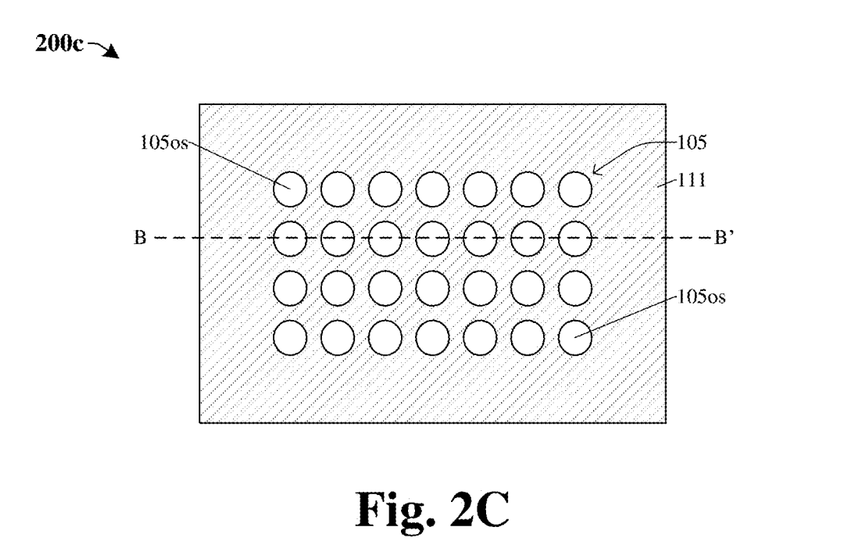

FIG. 2C illustrates a top view 200c of some alternative embodiments of the support structure 105 taken along cut line A-A' of FIG. 1. FIG. 1 illustrates some embodiments of a cross-sectional view taken along cut line B-B' of FIG. 2C.

The plurality of support structure openings 105os extend through the support structure layer 111 and respectively have a circular and/or elliptical shape. The plurality of support structure openings 105os may be arranged as an array comprising columns and/or rows across the carrier substrate opening (101 of FIG. 1). In some embodiments, the plurality of support structure openings 105os are directly aligned above the filter openings 107. In some embodiments, the support structure 105 is configured as a second particle filter. In such embodiments, the support structure 105 is configured to block and/or remove particles (e.g., by a shape/size of the support structure openings 105os and/or a material of the support structure layer 111) from air that passes from a first surface of the support structure 105 to an opposite second surface of the support structure 105. Thus, the support structure 105 may increase a structural integrity of the particle filter 106 and function as a second particle filter, thereby further increasing a performance, reliability, and endurance of the MEMS microphone 100. In some embodiments, the support structure 105 has a first material (e.g., silicon), and the particle filter (106 of FIG. 1) has a second material (e.g., silicon nitride, and/or polysilicon) different than the first material.

Figure 2D:
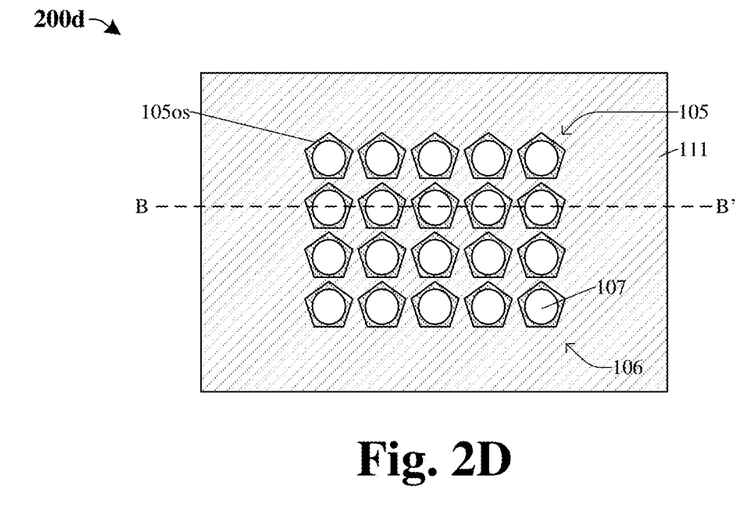

FIG. 2D illustrates a top view 200d of some alternative embodiments of the particle filter 106 and the support structure 105 taken along cut line A-A' of FIG. 1. FIG. 1 illustrates some embodiments of a cross-sectional view taken along cut line B-B' of FIG. 2D.

The plurality of support structure openings 105os extend through the support structure layer 111 and respectively have a polygon shape (e.g., a triangle, a rectangle, a pentagon, etc.). The plurality of filter openings 107 underlie the support structure 105 and respectively have a circular and/or elliptical shape. Thus, the filter openings 107 may respectively have a different shape than the support structure openings 105os. The plurality of support structure openings 105os are respectively larger than a corresponding underlying filter opening 107. In further embodiments, the support structure openings 105os may respectively be smaller than a corresponding underlying filter opening 107 (not shown). In further embodiments, the support structure 105 functions as a second particle filter with different opening shapes than the particle filter 106. This may further decrease an ability for particles to reach the MEMS structure (102 of FIG. 1), thereby further increasing a performance, reliability, and endurance of the MEMS microphone (100 of FIG. 1).

Figure 3A:
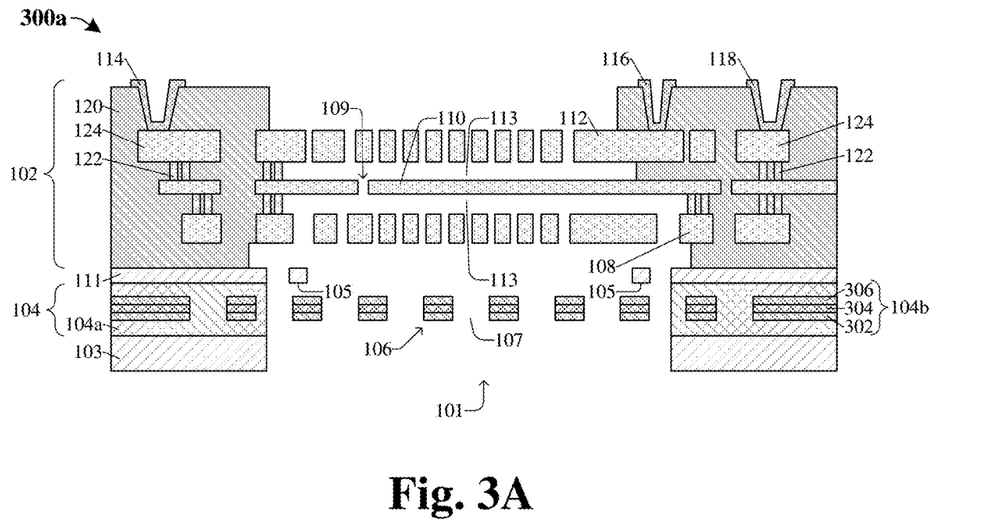
FIGS. 3A-B illustrate cross-sectional views of some embodiments of a MEMS microphone with a particle filter and a support structure.

FIG. 3A illustrates a cross-sectional view of a MEMS microphone 300a corresponding to some alternative embodiments of the MEMS microphone 100 of FIG. 1.

In some embodiments, the particle filter layer 104b comprises a lower particle filter layer 302, a middle particle filter layer 304, and an upper particle filter layer 306. The lower particle filter layer 302 may, for example, be or comprise silicon, a nitride, silicon nitride, or the like and/or have a thickness within a range of about 0.2 to 1 micrometer. The middle particle filter layer 304 may, for example, be or comprise polysilicon, un-doped polysilicon, or the like and/or have a thickness within a range of about 0.2 to 1 micrometer. The upper particle filter layer 306 may, for example, be or comprise silicon, a nitride, silicon nitride, or the like and/or have a thickness within a range of about 0.2 to 1 micrometer. In some embodiments, the layers within the particle filter layer 104b may each have a substantially same thickness. In further embodiments, the lower particle filter layer 302 and the upper particle filter layer 306 may comprise a same material (e.g., silicon nitride). In some embodiments, the particle filter layer 104b includes a polysilicon layer (e.g., the middle particle filter layer 304) disposed between two silicon nitride layers (e.g., the lower and upper particle filter layers 302, 306) and configured to decrease a stress induced upon the particle filter 106, thereby increasing a structural integrity and reliability of the particle filter 106. In yet further embodiments, the conductive vias 122, conductive wires 124, first and second back plates 108, 112, the diaphragm 110, and the particle filter 106 may respectively comprise a same material (e.g., metal, polysilicon, or the like).

Figure 3B:
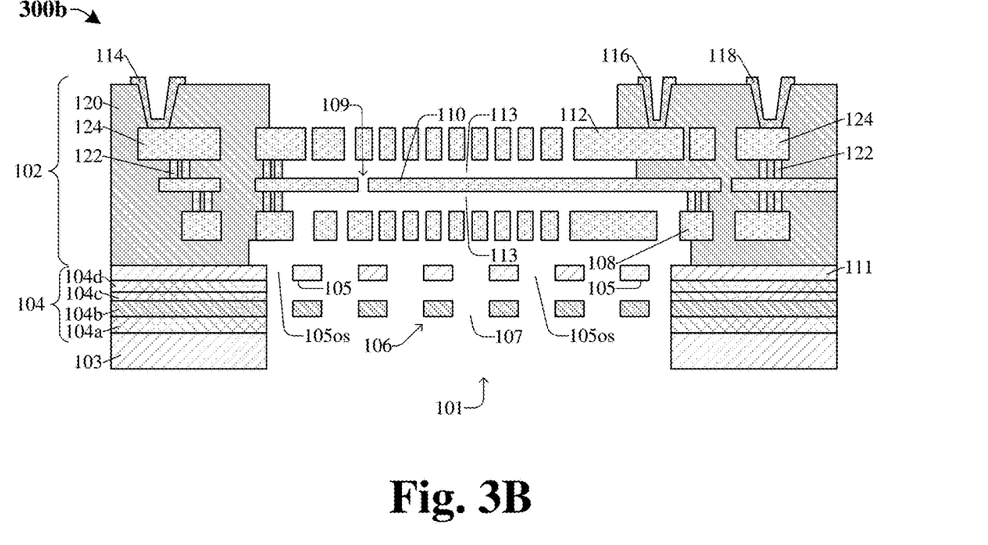

FIG. 3B illustrates a cross-sectional view of a MEMS microphone 300b corresponding to some alternative embodiments of the MEMS microphone 100 of FIG. 1.

The filter stack 104 includes a first dielectric layer 104a, a particle filter layer 104b, a second dielectric layer 104c, and a third dielectric layer 104d. In some embodiments, the first, second, and third dielectric layers 104a, 104c, 104d may be or comprise a first material (e.g., an oxide, such as silicon dioxide) and the particle filter layer 104b may be or comprise a second material (e.g., a nitride (such as silicon nitride), polysilicon, etc.) different than the first material. Further, as illustrated in FIG. 3B, the support structure layer 111 has a plurality of substrate sidewalls that define a plurality of support structure openings 105os and the particle filter layer 104b has a plurality of particle filter sidewalls that define the plurality of filter openings 107. In some embodiments, the plurality of substrate sidewalls are laterally aligned with the plurality of particle filter sidewalls. In such embodiments, the plurality of support structure openings 105os respectively overlie a corresponding filter opening 107 and the support structure 105 is configured as a second particle filter, as illustrated and described in FIG. 2C.

Figure 4:
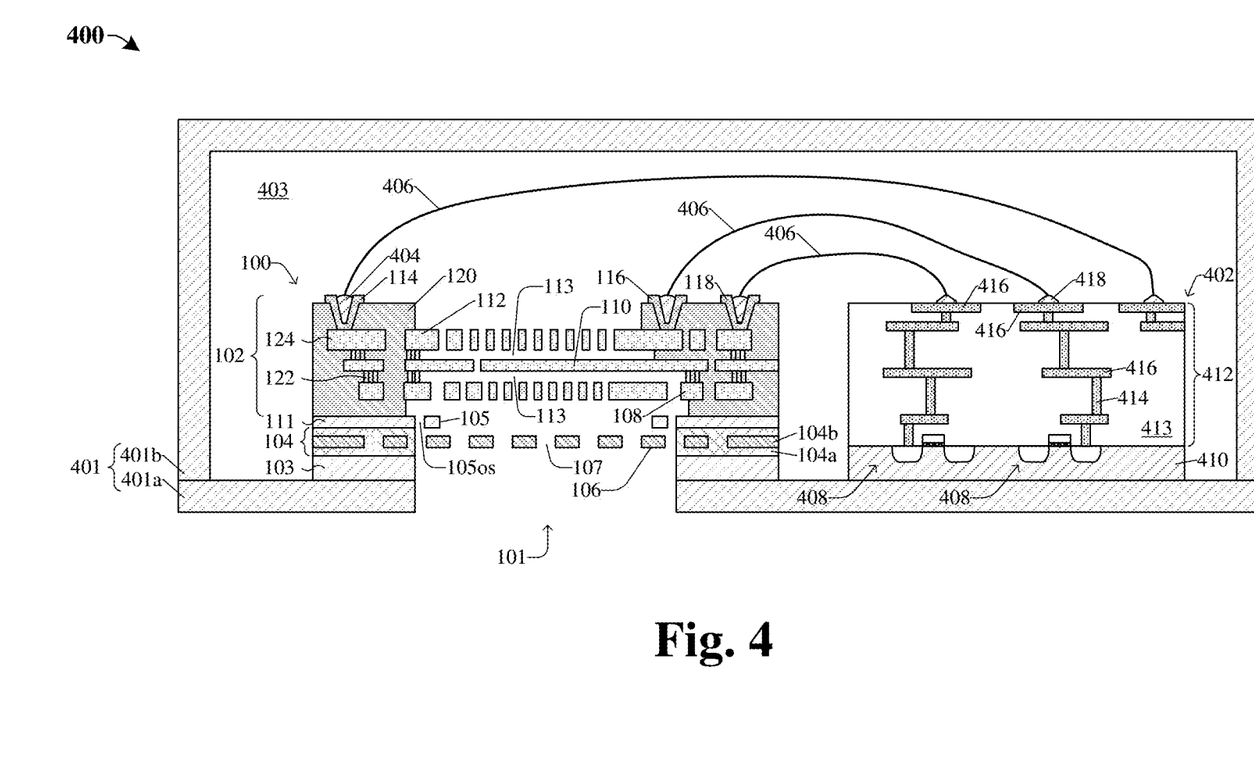
FIG. 4 illustrates a cross-sectional view of some embodiments of an integrated chip including some embodiments of the MEMS microphone of FIG. 1 wire bonded to a complementary metal-oxide-semiconductor (CMOS) integrated circuit (IC) die.

FIG. 4 illustrates a cross-sectional view of some embodiments of an integrated chip 400 including some alternative embodiments of the MEMS microphone 100 of FIG. 1 wire bonded to a complementary metal-oxide-semiconductor (CMOS) integrated circuit (IC) die 402.

The integrated chip 400 includes the MEMS microphone 100 laterally adjacent to the CMOS IC die 402 and disposed within a cavity 403 of a package 401. In some embodiments, the support structure layer 111 of the MEMS microphone 100 includes the support structure 105 configured to increase a structural integrity of the MEMS microphone 100. In some embodiments, the CMOS IC die 402 may be an application-specific integrated circuit (ASIC). In some embodiments, the cavity 403 is defined by inner sidewalls of the package 401. The package 401 includes a front-side structure 401a and an enclosure structure 401b. The CMOS IC die 402 and the MEMS microphone 100 are disposed on the front-side structure 401a. In some embodiments, an opening (i.e., inlet) to the package 401 may be the carrier substrate opening 101 of the MEMS microphone 100, such that any air entering or leaving the cavity 403 passes through the particle filter 106.

The CMOS IC die 402 includes a back-end-of-line (BEOL) metallization stack 412 overlying a CMOS substrate 410. The BEOL metallization stack comprises an inter-level dielectric (ILD) structure 413, interconnect wires 416, and interconnect vias 414. The CMOS substrate 410 and the ILD structure 413 include electronic components such as transistors 408, and/or other electric components (not shown), such as one or more capacitors, resistors, inductors, and/or diodes. The CMOS substrate 410 may, for example, be or comprise a bulk semiconductor substrate or a silicon-on-insulator (SOI) substrate. The ILD structure 413 may comprise one or more stacked ILD layers, which respectively comprise a low-k dielectric (i.e., a dielectric material with a dielectric constant less than about 3.9), and oxide (e.g., silicon dioxide), or the like. The interconnect vias and wires 414, 416 may, for example, respectively be or comprise a conductive material, such as aluminum, copper, tungsten, or the like.

A solder ball 404 is disposed over each electrical contact 114, 116, 118 of the MEMS microphone 100. The solder balls 404 provide contact points for a plurality of bond wires 406. A bond pad 418 overlies a top layer of interconnect wires 416 and provides a wire bonding location for the bond wires 406 on the CMOS IC die 402. In some embodiments, the transistors 408 are electrically coupled to the electrical contacts 114, 116, 118 by way of the BEOL metallization stack 412, the bond wires 406, and the bond pads 418. The transistors 408 may be configured to receive signals from the first back plate 108, the second back plate 112, and/or the diaphragm 110.

FIGS. 5-13 illustrate cross-sectional views 500-1300 of some embodiments of a method of forming a MEMS microphone with a particle filter and a support structure according to the present disclosure. Although the cross-sectional views 500-1300 shown in FIGS. 5-13 are described with reference to a method, it will be appreciated that the structures shown in FIGS. 5-13 are not limited to the method but rather may stand alone separate of the method. Furthermore, although FIGS. 5-13 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
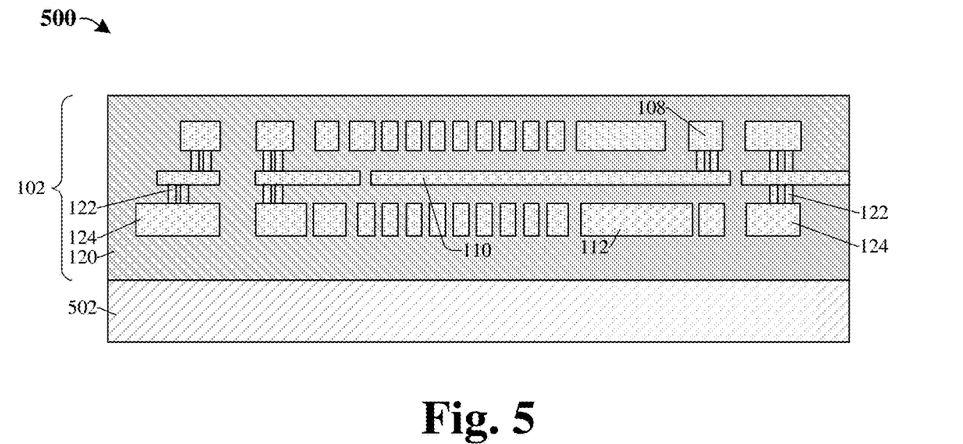
FIGS. 5-13 illustrate cross-sectional views of some embodiments of a method of forming a MEMS microphone with a particle filter and a support structure.

As shown in cross-sectional view 500 of FIG. 5, a MEMS structure 102 is formed over a sacrificial carrier substrate 502. In some embodiments, the sacrificial carrier substrate 502 may, for example, be a bulk substrate (e.g., a bulk silicon substrate), a silicon-on-insulator (SOI) substrate, or another suitable substrate. The MEMS structure 102 includes conductive wires 124, conductive vias 122, an inter-level dielectric (ILD) structure 120, a first back plate 108, a second back plate 112, and a diaphragm 110 disposed between the first and second back plates 108, 112. The ILD structure 120 may be and/or comprise one or more dielectric layers. The one or more dielectric layers may, for example, be or comprise an oxide, such as silicon dioxide, or another suitable oxide. In some embodiments, a process for forming the MEMS structure 102 includes forming a bottommost layer of the conductive wires 124 by a single damascene process, and subsequently forming a bottommost layer of the conductive vias 122 by the single damascene process. Further, in some embodiments, the process includes forming remaining layers of the conductive vias and wires 122, 124 by repeatedly performing a dual damascene process.

Additionally, the first back plate 108, the second back plate 112, and the diaphragm 110 may be formed during the dual damascene process or the single damascene process of a corresponding layer of the conductive wires 124. For example, the second back plate 112 may be formed concurrently with the single damascene process used to form the bottommost layer of the conductive wires 124. In another example, the first back plate 108, the second back plate 112, and the diaphragm 110 may each be formed by depositing a layer of polysilicon (e.g., by chemical vapor deposition (CVD), physical vapor deposition (PVD), or another suitable deposition process), patterning the layer of polysilicon according to a masking layer (not shown), and performing a removal process to remove the masking layer. In some embodiments, the conductive wires 124, the conductive vias 122, the first back plate 108, the second back plate 112, and the diaphragm 110 may, for example, respectively comprise polysilicon, metal, or another suitable conductive material.

Figure 6:
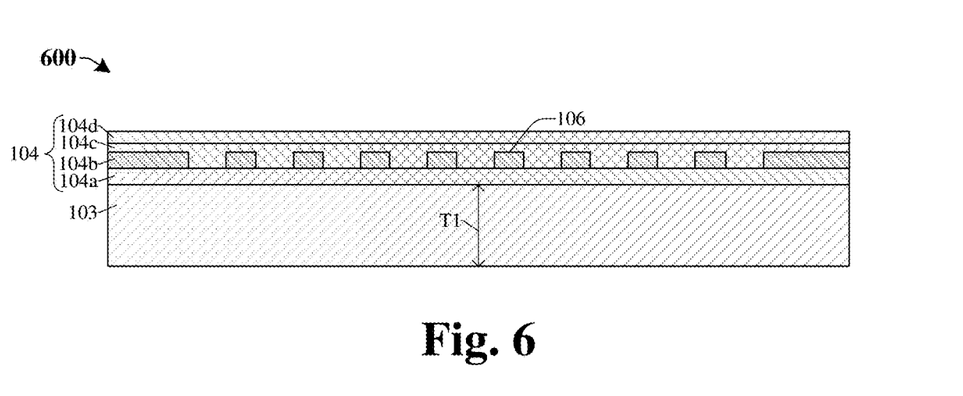

As shown in cross-sectional view 600 of FIG. 6, a carrier substrate 103 is provided. In some embodiments, the carrier substrate 103 may, for example, be or comprise a bulk substrate (e.g., a bulk silicon substrate), a silicon-on-insulator (SOI) substrate, or another suitable substrate and/or may have an initial thickness T1 within a range of about 250 to 725 micrometers. A filter stack 104 is formed over the carrier substrate. The filter stack 104 includes a first dielectric layer 104a, a particle filter layer 104b, a second dielectric layer 104c, and a third dielectric layer 104d.

In some embodiments, a process for forming the filter stack 104 includes: depositing the first dielectric layer 104a over the carrier substrate 103 and subsequently performing a first annealing process; depositing the particle filter layer 104b over the first dielectric layer 104a, performing a second annealing process, and patterning the particle filter layer 104b to define a particle filter 106; depositing the second dielectric layer 104c over the particle filter layer 104b and subsequently performing a first planarization process (e.g., a chemical-mechanical planarization (CMP) process); and depositing the third dielectric layer 104d over the second dielectric layer 104c and subsequently performing a second planarization process (e.g., a CMP process). In some embodiments, patterning the particle filter layer 104b includes: forming a masking layer (not shown) over the particle filter layer 104b; exposing unmasked regions of the particle filter layer 104b to one or more etchants, thereby defining the particle filter 106; and performing a removal process to remove the masking layer. In some embodiments, the layers of the filter stack 104 may respectively, for example, be deposited and/or grown by CVD, PVD, atomic layer deposition (ALD), thermal oxidation, or another suitable deposition process. In further embodiments, the first, second, and third dielectric layers 104a, 104c, 104d may respectively be formed by plasma-enhanced chemical vapor deposition (PECVD), high density plasma chemical vapor deposition (HDPCVD), low pressure chemical vapor deposition (LPCVD), or another suitable deposition process.

In some embodiments, the first dielectric layer 104a may, for example, be or comprise an oxide, such as silicon dioxide, or another dielectric material and/or may have a thickness within a range of about 10 to 40 micrometers. In some embodiments, the particle filter layer 104b may, for example, be or comprise polysilicon, silicon nitride, or the like and/or may have a thickness within a range of about 0.5 to 10 micrometers. In some embodiments, the second dielectric layer 104c may, for example, be or comprise an oxide, such as silicon dioxide, or another dielectric material and/or may have a thickness of about 2 micrometers. In further embodiments, the third dielectric layer 104d may, for example, be or comprise an oxide, such as silicon dioxide, or another dielectric material and/or may have a thickness of about 1 micrometer. In further embodiments, the first, second, and third dielectric layers 104a, 104c, 104d may respectively be or comprise a same material.

Figure 7:
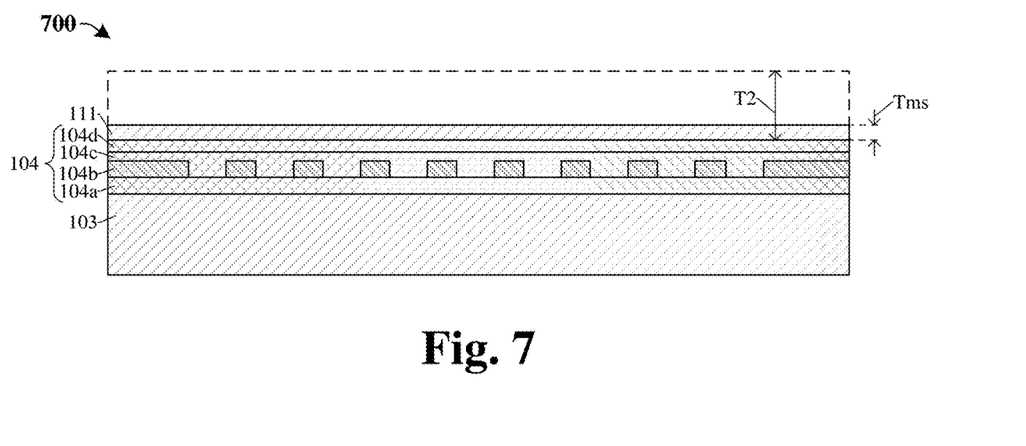

As shown in cross-sectional view 700 of FIG. 7, a support structure layer 111 formed on the third dielectric layer 104d. In some embodiments, the forming process includes bonding the support structure layer 111 to the third dielectric layer 104d. In such embodiments, the bonding process may, for example, be a fusion bonding process, or another suitable bonding process. In some embodiments, the support structure layer 111 may, for example, be a bulk substrate (e.g., a bulk silicon substrate), a silicon-on-insulator (SOI) substrate, or another suitable substrate with an initial thickness T2. After performing the bonding process, a thinning process is performed on the support structure layer 111 to reduce the initial thickness T2 of the support structure layer 111 to a thickness Tms. In some embodiments, the thickness Tms is within a range of about 10 to 200 micrometers. In some embodiments, the thinning process is performed by a mechanical grinding process, a CMP process, some other thinning process, or any combination of the foregoing. For example, the thinning process may be performed wholly by a mechanical grinding process.

In further embodiments, the support structure layer 111 may be formed by depositing the support structure layer 111 over the filter stack 104. The deposition process may, for example, be or comprise CVD, PVD, LPCVD, PECVD, or another deposition process. For example, the deposition process be performed wholly by a CVD process, such as PECVD. In such embodiments, the support structure layer 111 may, for example, be or comprise polysilicon, intrinsic polysilicon, or the like and/or may have a thickness of about 4 micrometers. This may reduce a physical strain induced upon the particle filter 106 (e.g., by omitting the bonding process and/or the thinning process of FIG. 7), and/or decrease cost and time associated with forming the support structure layer 111.

Figure 8:
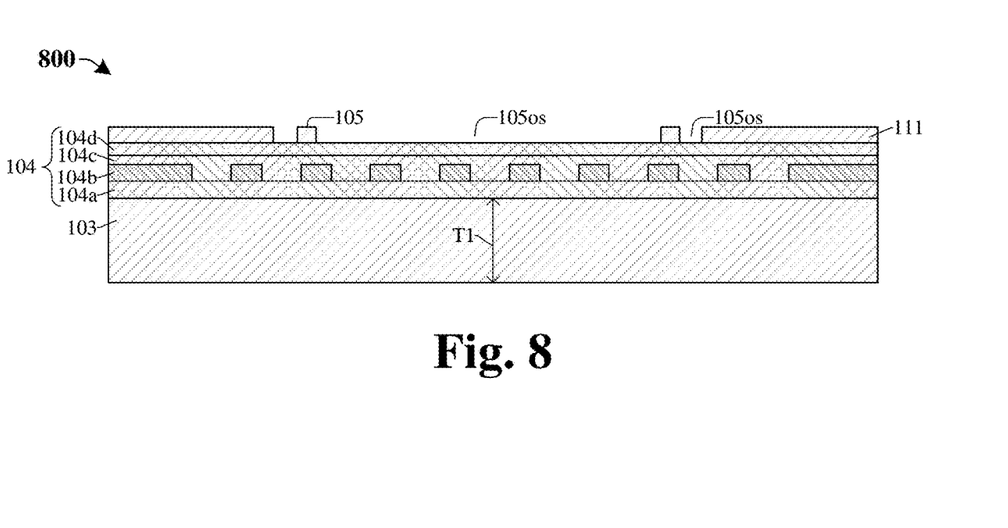

As shown in cross-sectional view 800 of FIG. 8, the support structure layer 111 is patterned, thereby defining support structure openings 105os extending through the support structure layer 111 and a support structure 105. In some embodiments, the support structure layer 111 is patterned in such a manner that the support structure 105 is configured as a second particle filter, such as illustrated and described in FIGS. 3B and/or 2C. In some embodiments, a process for patterning the support structure layer 111 includes: forming a masking layer over the support structure layer 111; exposing unmasked regions of the support structure layer 111 to one or more etchants (e.g., sulfur fluoride, such as sulfur hexafluoride ($SF_6$), etc.), thereby defining a support structure 105; and performing a removal process to remove the masking layer. In some embodiments, the aforementioned patterning process includes performing a dry etch process, a plasma etch process, or another suitable etch process.

Figure 9:
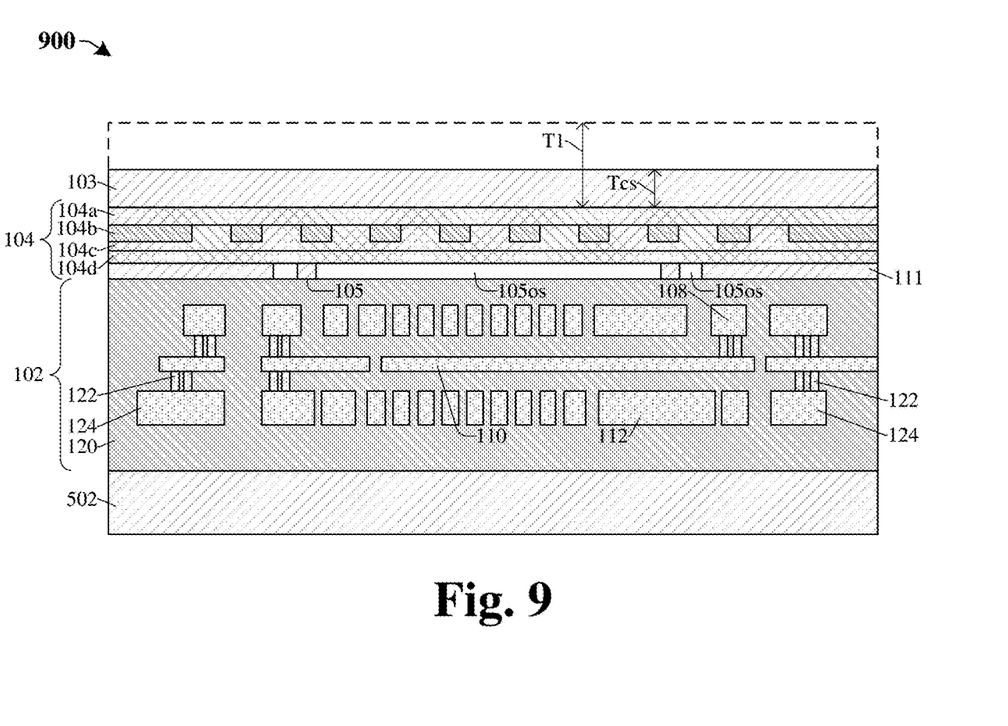

As shown in cross-sectional view 900 of FIG. 9, the support structure layer 111 is bonded to the MEMS structure 102. In some embodiments, the bonding process may, for example, be a fusion bonding process, or another suitable bonding process. After performing the bonding process, a thinning process is performed on the carrier substrate 103 to reduce the initial thickness T1 of the carrier substrate to a thickness Tcs. In some embodiments, the thickness Tcs is within a range of about 200 to 400 micrometers. In some embodiments, the thinning process is performed by a mechanical grinding process, a CMP process, some other thinning process, or any combination of the foregoing. For example, the thinning process may be performed wholly by a mechanical grinding process.

Figure 10:
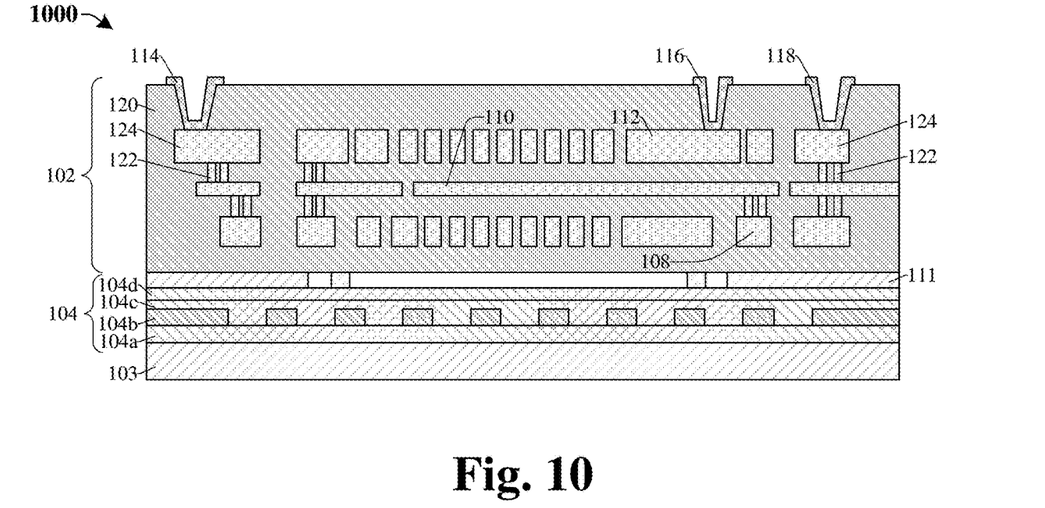

As shown in cross-sectional view 1000 of FIG. 10, the structure of FIG. 9 is flipped and a removal process is performed on the sacrificial carrier substrate (502 of FIG. 9), thereby removing the sacrificial carrier substrate (502 of FIG. 9). In some embodiments, the removal process of the sacrificial carrier substrate (502 of FIG. 9) includes: performing a grinding process (e.g., a mechanical grinding process) on the sacrificial carrier substrate (502 of FIG. 9); and performing a wet etch process on a remaining portion of the sacrificial carrier substrate (502 of FIG. 9) and/or the ILD structure 120, thereby exposing an upper surface of the ILD structure 120. In some embodiments, after removing the sacrificial carrier substrate (502 of FIG. 9), a deposition process is performed to form one or more ILD layers (e.g., comprising silicon dioxide) on the upper surface of the ILD structure 120. In such embodiments, the one or more ILD layers are a part of the ILD structure 120 and may be deposition by, for example, PECVD.

Also as shown in FIG. 10, electrical contacts 114, 116, 118 are formed in the ILD structure 120. In some embodiments, a process for forming the electrical contacts 114, 116, 118 includes: forming a masking layer (not shown) over the ILD structure 120; exposing unmasked regions of the ILD structure 120 to one or more etchants, thereby defining electrical contact openings; and depositing the electrical contacts 114, 116, 118 in the electrical contact openings. In such embodiments, the electrical contacts 114, 116, 118 may, for example, be deposited and/or grown by electroless plating, sputtering, electroplating, or another suitable deposition process. In some embodiments, the electrical contacts 114, 116, 118 may respectively, for example, be or comprise gold, nickel, or the like.

Figure 11:
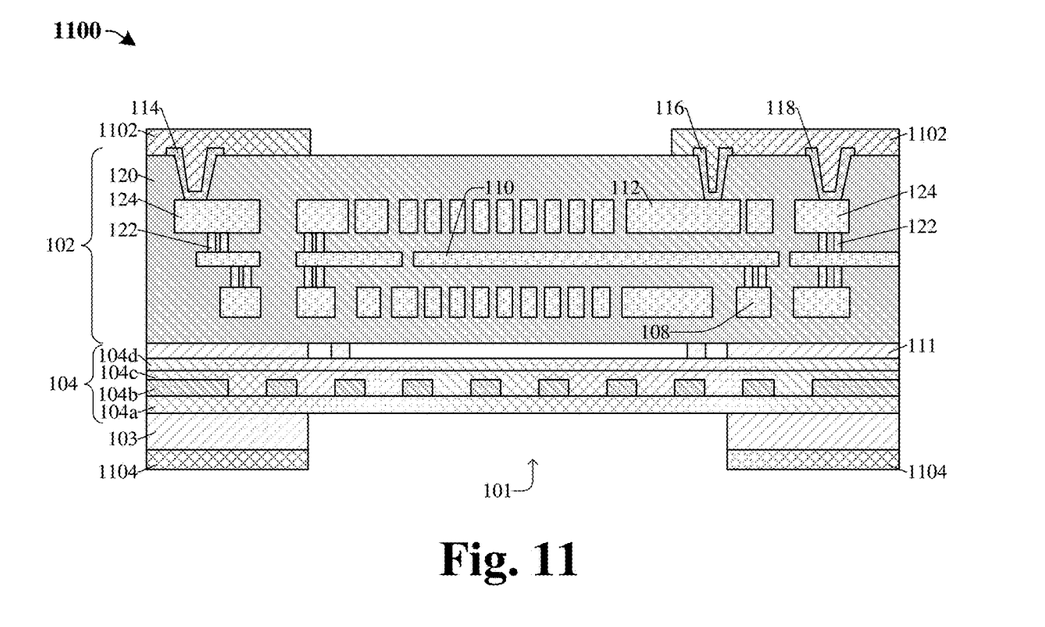

As shown in cross-sectional view 1100 of FIG. 11, an upper masking layer 1102 is formed over the upper surface of the ILD structure 120. The upper masking layer 1102 covers the electrical contacts 114, 116, 118 and is configured to protect the electrical contacts 114, 116, 118 during subsequent processing steps. A lower masking layer 1104 is formed on a lower surface of the carrier substrate 103. After forming the lower masking layer 1104, the carrier substrate 103 is patterned according to the lower masking layer 1104, thereby forming the carrier substrate opening 101 in the carrier substrate 103. In some embodiments, patterning the carrier substrate 103 includes performing a dry etch process, such as a plasma etch process and/or a deep reactive-ion etch (DRIE) process.

Figure 12:
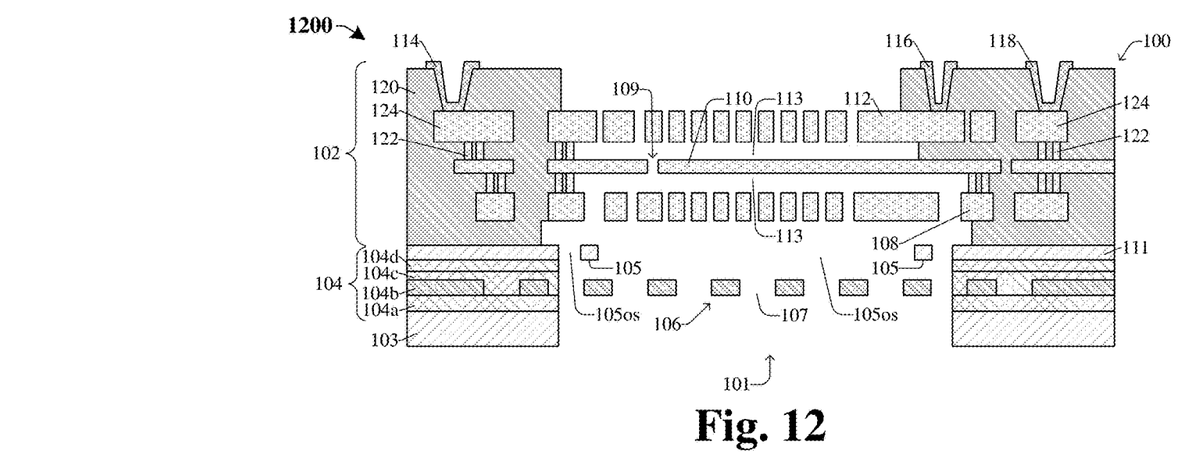

As shown in cross-sectional view 1200 of FIG. 12, a patterning process is performed on the structure of FIG. 11 according to the upper and/or lower masking layers 1102, 1104, thereby defining a MEMS microphone 100. In some embodiments, the patterning process on the structure of FIG. 11 includes performing a wet etch process and/or exposing the structure of FIG. 11 to one or more etchants. The patterning process removes a portion of the ILD structure 120, thereby defining the air volume space 113. Further, the patterning process removes the first, second, and third dielectric layers 104a, 104c, 104d from above and below the particle filter 106. After performing the patterning process, a removal process is performed to remove the upper and lower masking layers (1102, 1104 of FIG. 11). During the etching process, the particle filter 106 is freed and may be moved by the etchant and/or by movement of the MEMS microphone. The support structure 105 limits movement of the particle filter 106 so as to prevent damage to the particle filter 106 (e.g., so as to prevent the particle filter 106 from contacting the first back plate 108).

Figure 13:
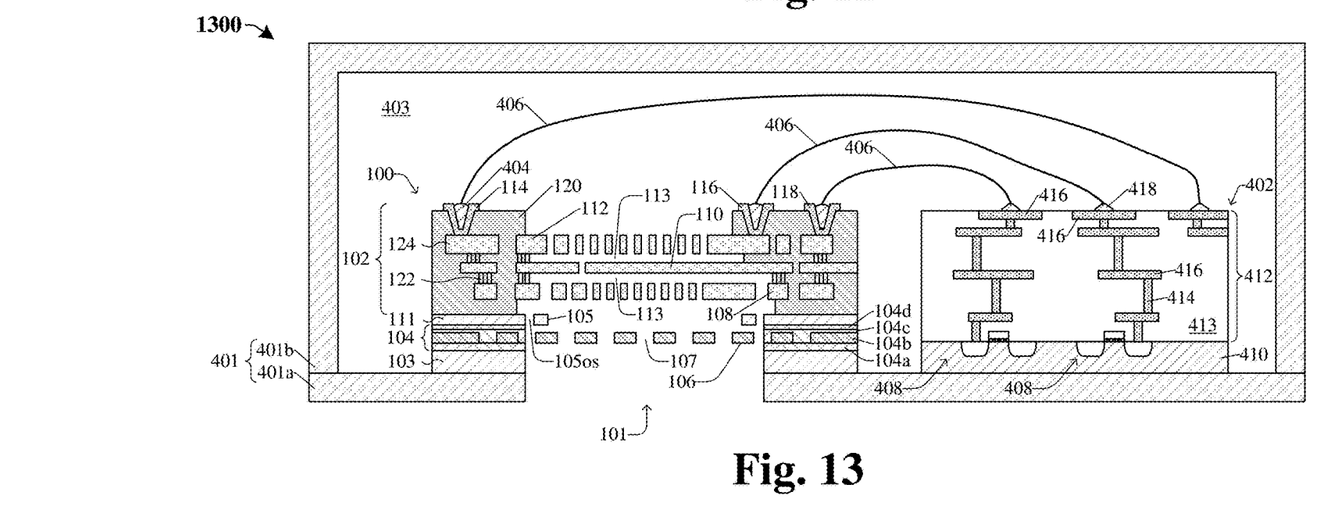

As shown in cross-sectional view 1300 of FIG. 13, the MEMS microphone 100 is bonded to a front-side structure 401a of a package 401. In some embodiments, the bonding process may, for example, be a fusion bonding process, or another suitable bonding process. The support structure adds structural support and/or limits movement of the particle filter 106 so as to prevent damage to the particle filter 106 during the aforementioned bonding process. Further, after performing the bonding process, the electrical contacts 114, 116, 118 are wire bonded to the CMOS IC die 402. Furthermore, after the wire bonding process, an enclosure structure 401b is formed over the front-side structure 401a, thereby defining a cavity 403. In some embodiments, an opening (i.e., inlet) to the package 401 may be the carrier substrate opening 101 of the MEMS microphone 100, such that any air entering or leaving the cavity 403 passes through the particle filter 106.

In some embodiments, because the first and second dielectric layers 104a, 104c surround the particle filter layer 104b during the processing steps of FIGS. 6-12, the particle filter layer 104b is protected from particles and/or damage due to the processing steps of FIGS. 6-12. Thus, particles may not accumulate around and/or on the particle filter layer 104b during the processing steps of FIGS. 6-12, thereby increasing an ability of the particle filter 106 to block particles from reaching the diaphragm 110. In further embodiments, because the particle filter 106 is freed by the wet etch process of FIG. 12, damage to the particle filter 106 may be mitigated. For example, in yet further embodiments, if the particle filter 106 was freed by a dry etch process, the particle filter 106 may be more prone to collecting particles and/or having structural damage, thereby decreasing a performance of the particle filter 106.

Figure 14:
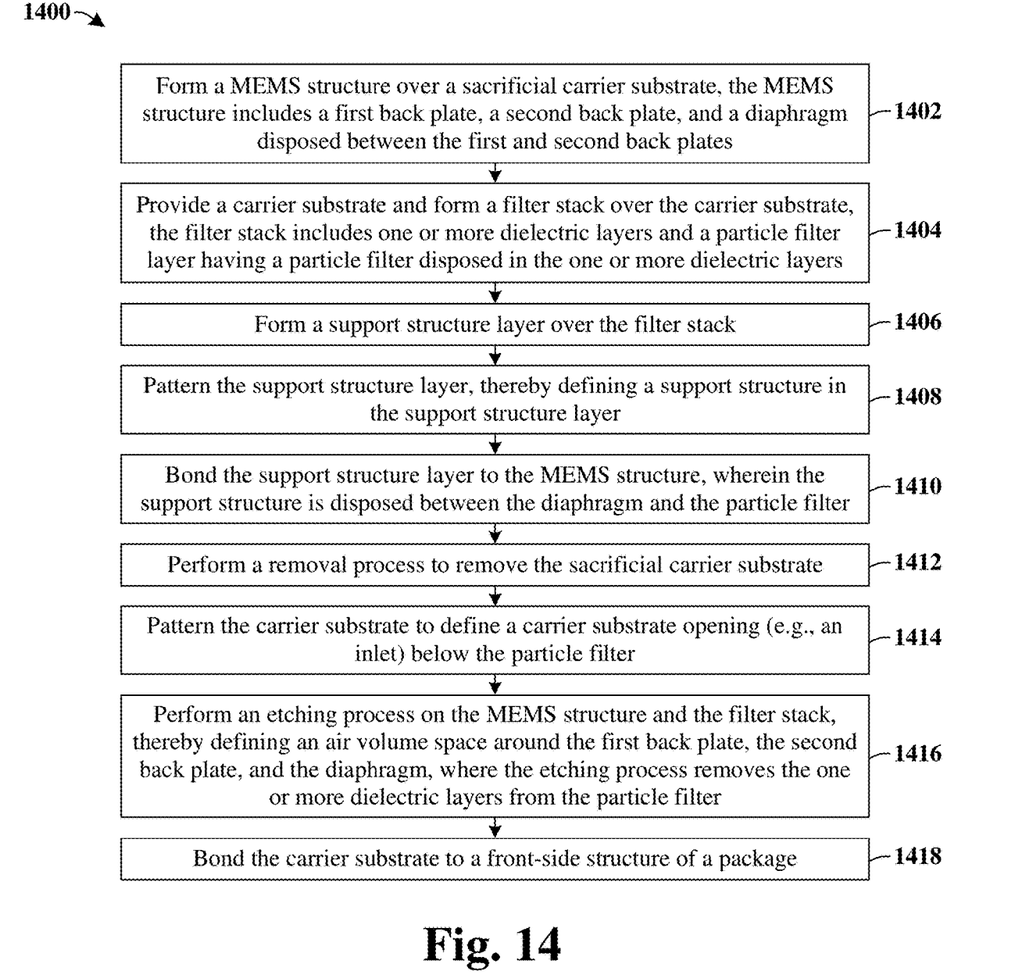
FIG. 14 illustrates a methodology in flowchart format that illustrates some embodiments of a method of forming a MEMS microphone with a particle filter and a support structure.

FIG. 14 illustrates a method 1400 of forming a MEMS microphone with a particle filter and a support structure in accordance with some embodiments. Although the method 1400 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1402, a MEMS structure is formed over a sacrificial carrier substrate. The MEMS structure includes a first back plate, a second back plate, and a diaphragm disposed between the first and second back plates. FIG. 5 illustrates a cross-sectional view 500 corresponding to some embodiments of act 1402.

At act 1404, a carrier substrate is provided and a filter stack is formed over the carrier substrate. The filter stack includes one or more dielectric layers and a particle filter layer having a particle filter disposed in the one or more dielectric layers. FIG. 6 illustrates a cross-sectional view 600 corresponding to some embodiments of act 1404.

At act 1406, a support structure layer is formed over the filter stack. FIG. 7 illustrates a cross-sectional view 700 corresponding to some embodiments of act 1406.

At act 1408, the support structure layer is patterned, thereby defining a support structure in the support structure layer. FIG. 8 illustrates a cross-sectional view 800 corresponding to some embodiments of act 1408.

At act 1410, the support structure layer is bonded to the MEMS structure. The support structure is disposed between the diaphragm and the particle filter. FIG. 9 illustrates a cross-sectional view 900 corresponding to some embodiments of act 1410.

At act 1412, a removal process is performed to remove the sacrificial carrier substrate. FIG. 10 illustrates a cross-sectional view 1000 corresponding to some embodiments of act 1412.

At act 1414, the carrier substrate is patterned to define a carrier substrate opening (e.g., an inlet) below the particle filter. FIG. 11 illustrates a cross-sectional view 1100 corresponding to some embodiments of act 1414.

At act 1416, an etching process is performed on the MEMS structure and the filter stack, thereby defining an air volume space around the first back plate, the second back plate, and the diaphragm. The etching process removes the one or more dielectric layers from the particle filter. FIG. 12 illustrates a cross-sectional view 1200 corresponding to some embodiments of act 1416.

At act 1418, the carrier substrate is bonded to a front-side structure of a package. FIG. 13 illustrates a cross-sectional view 1300 corresponding to some embodiments of act 1418.

Accordingly, in some embodiments, the present disclosure relates to a MEMS microphone including a support structure disposed between a particle filter and a diaphragm.

In some embodiments, the present application provides a microphone including a carrier substrate having opposing sidewalls that define a carrier substrate opening; a microelectromechanical systems (MEMS) structure overlying the carrier substrate, wherein the MEMS structure includes a diaphragm having opposing sidewalls that define a diaphragm opening overlying the carrier substrate opening; a particle filter disposed between the carrier substrate and the MEMS structure, wherein a plurality of filter openings extend through the particle filter; and a support structure layer disposed between the particle filter and the MEMS structure, wherein the support structure layer includes a support structure having one or more segments spaced laterally between the opposing sidewalls of the carrier substrate, wherein the one or more segments of the support structure are spaced laterally between the plurality of filter openings.

In some embodiments, the present application provides a microelectromechanical system (MEMS) device including a MEMS structure disposed along an upper surface of a support structure layer, wherein the MEMS structure includes a first back plate and a diaphragm vertically separated from the first back plate; a carrier substrate underlying the support structure layer, wherein the carrier substrate has opposing sidewalls defining a carrier substrate opening, wherein the carrier substrate opening underlies the diaphragm; a filter stack disposed between the carrier substrate and the support structure layer, wherein the filter stack includes a particle filter layer having a particle filter, wherein the particle filter includes a plurality of filter openings that extends through the particle filter layer and is laterally between the opposing sidewalls of the carrier substrate; and a support structure disposed between the filter stack and the MEMS structure, wherein the support structure is a segment of the support structure layer laterally between support structure openings that extend through the support structure layer.

In some embodiments, the present application provides a method for manufacturing a microelectromechanical systems (MEMS) device, the method includes forming a MEMS structure over a sacrificial substrate, the MEMS structure includes a moveable diaphragm; forming a filter stack over a carrier substrate, wherein the filter stack includes one or more dielectric layers and a particle filter layer having a particle filter disposed in the one or more dielectric layers; forming a support structure layer over the filter stack; patterning the support structure layer to define a support structure in the support structure layer, wherein the support structure has one or more segments; bonding the support structure layer to the MEMS structure; and patterning the carrier substrate to define a carrier substrate opening, wherein the one or more segments of the support structure are spaced laterally between opposing sidewalls of the carrier substrate that define the carrier substrate opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a microelectromechanical systems (MEMS) device, the method comprising:
   forming a filter stack over a carrier substrate, wherein the filter stack comprises a particle filter layer having a particle filter;
   forming a support structure layer over the filter stack;
   performing a patterning process on the support structure layer to define a support structure in the support structure layer such that the support structure has one or more segments; and
   bonding the support structure to a MEMS structure, wherein the MEMS structure comprises a movable element.

2. The method of claim 1, wherein the support structure layer is disposed on the filter stack during the patterning process.

3. The method of claim 1, further comprising:
   patterning the carrier substrate to define a carrier substrate opening under the MEMS structure, wherein patterning the carrier substrate occurs after bonding the support structure to the MEMS structure.

4. The method of claim 1, wherein forming the support structure layer comprises:
   performing a thinning process on the support structure layer, wherein a thickness of the support structure layer is less than a thickness of the carrier substrate.

5. The method of claim 1, wherein forming the support structure layer comprises:
depositing the support structure layer on an upper surface of the filter stack by a chemical vapor deposition (CVD) process, wherein the support structure layer and the particle filter respectively comprise polysilicon.

6. The method of claim 1, wherein forming the filter stack comprises:
forming a first dielectric layer over the carrier substrate;
forming the particle filter layer over the first dielectric layer; and
patterning the particle filter layer to define the particle filter while the particle filter layer is disposed on the carrier substrate.

7. The method of claim 6, wherein forming the filter stack further comprises:
forming a second dielectric layer over the particle filter layer; and
forming a third dielectric layer over the second dielectric layer;
wherein the support structure layer is formed along an upper surface of the third dielectric layer.

8. The method of claim 7, wherein an annealing process is performed after forming the particle filter layer and before patterning the particle filter layer to define the particle filter.

9. A method for forming a semiconductor structure, the method comprising:
depositing a particle filter layer over a carrier substrate;
patterning the particle filter layer while the particle filter layer is disposed on the carrier substrate to define a particle filter in the particle filter layer;
forming a support structure layer over the particle filter layer such that the support structure layer comprises a support structure, wherein the support structure comprises a plurality of support structure openings that extend through the support structure layer; and
bonding a microelectromechanical systems (MEMS) structure to the support structure, wherein the MEMS structure comprises a moveable element.

10. The method of claim 9, wherein the MEMS structure is formed over a sacrificial substrate before bonding the MEMS structure to the support structure, the method further comprising:
performing a thinning process on the carrier substrate; and
removing the sacrificial substrate from along the MEMS structure after bonding the MEMS structure to the support structure.

11. The method of claim 9, wherein forming the support structure comprises:
patterning the support structure layer while the support structure layer is disposed on the particle filter layer.

12. The method of claim 9, wherein after patterning the particle filter layer the particle filter comprises a plurality of filter openings that extends through the particle filter layer, wherein when viewed from above the support structure openings respectively have a different shape than the filter openings.

13. The method of claim 9, wherein the particle filter comprises polysilicon and the support structure comprises silicon.

14. A microelectromechanical systems (MEMS) device comprising:
a MEMS structure overlying a carrier substrate, wherein the MEMS structure comprises a moveable element;
a filter stack disposed between the carrier substrate and the MEMS structure, wherein the filter stack includes a particle filter layer having a particle filter, wherein a plurality of filter openings extends through the particle filter; and
a support structure layer disposed between the particle filter and the MEMS structure, wherein a plurality of support structure openings extends through the support structure layer, wherein when viewed from above the support structure openings respectively have a different shape than the filter openings.

15. The MEMS device of claim 14, wherein the particle filter layer comprises an upper particle filter layer, a lower particle filter layer, and a middle particle filter layer disposed between the upper and lower particle filter layers, wherein the upper and lower particle filter layers comprise a first material, and wherein the middle particle filter layer comprises a second material different from the first material.

16. The MEMS device of claim 15, wherein the first material is silicon nitride and the second material is polysilicon.

17. The MEMS device of claim 14, wherein the support structure layer comprises first elongated support segments extending between a first pair of opposing inner sidewalls of the support structure layer, wherein a width of each first elongated support segment is less than a diameter of each filter opening.

18. The MEMS device of claim 17, wherein the first elongated support segments extend continuously in a first direction, wherein the support structure layer further comprises second elongated support segments extending continuously in a second direction orthogonal to the first direction, wherein the first and second elongated support segments respectively have straight opposing sidewalls.

19. The MEMS device of claim 14, wherein the support structure openings have a polygon shape and the filter openings have a circular shape.

20. The method of claim 1, wherein the carrier substrate comprises opposing sidewalls defining an opening.

* * * * *